US010251275B2

(12) United States Patent
Santo (10) Patent No.: US 10,251,275 B2
(45) Date of Patent: Apr. 2, 2019

(54) CONTROL CIRCUIT BOARD AND ROBOT CONTROL DEVICE (71) Applicant: KAWASAKI JUKOGYO KABUSHIKI KAISHA, Kobe-shi, Hyogo (JP)

(72) Inventor: Yoshiki Santo, Akashi (JP)

(73) Assignee: KAWASAKI JUKOGYO KABUSHIKI KAISHA, Kobe-shi (JP)

( * ) Notice: Subject to any disclaimer, the term of this patent is extended or adjusted under 35 U.S.C. 154(b) by 0 days.

(21) Appl. No.: 15/523,472

(22) PCT Filed: Oct. 29, 2015

(86) PCT No.: PCT/JP2015/080627
§ 371 (c)(1),
(2) Date: May 1, 2017

(87) PCT Pub. No.: WO2016/068264
PCT Pub. Date: May 6, 2016

(65) Prior Publication Data
US 2017/0318679 A1 Nov. 2, 2017

(30) Foreign Application Priority Data

Oct. 31, 2014 (JP) .................................. 2014-222881

(51) Int. Cl.
H05K 5/00 (2006.01)
H05K 1/18 (2006.01)
(Continued)

(52) U.S. Cl.
CPC ................ H05K 1/181 (2013.01); B25J 9/16 (2013.01); H05K 1/18 (2013.01); H05K 1/111 (2013.01);
(Continued)

(58) Field of Classification Search
CPC ................... H05K 1/182; H05K 1/181; H05K 2201/09372; H05K 2201/094;
(Continued)

(56) References Cited

U.S. PATENT DOCUMENTS

2003/0089978 A1* 5/2003 Miyamoto .......... H01L 23/3114
257/723
2006/0012395 A1 1/2006 Huppenthal et al.
(Continued)

FOREIGN PATENT DOCUMENTS

JP S61-93694 A 5/1986
JP S63-3153 U 1/1988
(Continued)

OTHER PUBLICATIONS

Janaury 12, 2016 International Search Report issued in International Patent Application No. PCT/JP2015/080627.
(Continued)

Primary Examiner — Binh B Tran
(74) Attorney, Agent, or Firm — Oliff PLC (57) ABSTRACT A control circuit board includes first and second elements on each surface of a board member. The first and the second elements respectively have first and third edge portions, which are opposite to each other and second and fourth edge portions which are opposite to each other. A plurality of signal input pins are provided to the first edge portion, a plurality of signal output pins are provided to the third edge portion, a plurality of between-element communication input pins are provided to the second edge portion, and a plurality of between-element communication output pins are provided to the fourth edge portion, respectively. A common signal is input to the first and second elements and a communication is performed between the first element and the second element. Loss of control function can be surely
(Continued)

prevented while suppressing enlargement of the board and increase of development/production cost.

6 Claims, 11 Drawing Sheets

(51) Int. Cl.
*B25J 9/16* (2006.01)
*H05K 7/00* (2006.01)
*H05K 1/11* (2006.01)

(52) U.S. Cl.
CPC .............. *H05K 2201/09372* (2013.01); *H05K 2201/09436* (2013.01); *H05K 2201/09445* (2013.01); *H05K 2201/10212* (2013.01); *H05K 2201/10545* (2013.01); *H05K 2201/10704* (2013.01)

(58) Field of Classification Search
CPC ......... H05K 2201/09409; H05K 2201/09418; H05K 2201/09427; H05K 2201/09436; H05K 2201/09445; H05K 2201/10689; H05K 1/111; H05K 2201/10704

USPC ................ 361/760, 764, 767, 772, 777, 783
See application file for complete search history.

(56) References Cited

U.S. PATENT DOCUMENTS

| | | | |
|---|---|---|---|
| 2009/0250255 A1* | 10/2009 | Shilling | ................. H01L 23/50 |
| | | | 174/260 |
| 2016/0089781 A1* | 3/2016 | Yamazaki | ............. B25J 9/0087 |
| | | | 700/249 |

FOREIGN PATENT DOCUMENTS

| | | |
|---|---|---|
| JP | H02-78118 A | 3/1990 |
| JP | H04-262591 A | 9/1992 |
| JP | 2004-330346 A | 11/2004 |
| JP | 2005-235074 A | 9/2005 |

OTHER PUBLICATIONS

May 23, 2018 Search Report issued in European Patent Application No. 15855357.8.

\* cited by examiner

CONTROL CIRCUIT BOARD AND ROBOT CONTROL DEVICE

TECHNICAL FIELD

The present invention relates to a control circuit board incorporated in a robot control device and a robot control device comprising the board, particularly to a control circuit board comprising a function to prevent loss of control function due to a single failure of an element configuring a control circuit, and a robot control device comprising the board.

BACKGROUND ART

In a multi-axis robot or the like which is used as an industrial robot, it is needed to emergently stop the robot so as to ensure safety in an emergency such as when a person and an obstacle gets in a working area and when operation failure occurs. IEC60204-1 and ISO10218-1 standards specify a plurality of stop patterns according to risk and working conditions (such as holding condition of objects) with regard to emergency stop of a robot.

As described above, it is extremely important to ensure safety of an industrial robot whose operation needs to be stopped in an emergency. Therefore, a robot control device is devised so as to prevent loss of control function due to a single failure of an element configuring a control circuit of a robot (Patent Document 1).

CITATION LIST

Patent Document

[Patent Document 1] Japanese Patent Application Laid-Open No. 2004-330346

SUMMARY OF INVENTION

Objects to be Achieved by the Invention

However, it is needed to increase the number and kinds of elements to be implemented to a board in order to devise a control circuit of a robot control device for preventing loss of its safety function, which causes problems of enlargement of the board and increase of development/production cost.

The present invention is made considering the above-mentioned problems of the conventional technologies, and its object is to provide a control circuit board capable of surely preventing loss of control function while suppressing enlargement of the board and increase of development/production cost, and a robot control device comprising the board.

Means for Achieving the Objects

In order to achieve the objects above, a first aspect of the present invention is a control circuit board incorporated in a robot control device, comprising: a board member; and a first element and a second element provided to each surface of the board member respectively, wherein the first element and the second element respectively have a first edge portion and a third edge portion which are opposite to each other and a second edge portion and a fourth edge portion which are opposite to each other, wherein a plurality of signal input pins are provided to the first edge portion, a plurality of signal output pins are provided to the third edge portion, a plurality of between-element communication input pins are provided to the second edge portion, and a plurality of between-element communication output pins are provided to the fourth edge portion, and wherein a common signal is input to the first element and the second element, and a communication is performed between the first element and the second element.

A second aspect of the present invention is that, in the first aspect, an arrangement regarding a pin function of the plurality of between-element communication input pins and the plurality of between-element communication output pins is common between the first element and the second element.

A third aspect of the present invention is that, in the first or second aspect, an arrangement regarding a pin function of the plurality of signal input pins and the plurality of signal output pins is common between the first element and the second element.

A fourth aspect of the present invention is that, in the first or second aspect, an arrangement regarding a pin function of the plurality of signal input pins and the plurality of signal output pins is inverted between the first element and the second element.

A fifth aspect of the present invention is that, in any one of the first to fourth aspects, the first to fourth edge portions of the first element and the first to fourth edge portions of the second element are arranged opposite to each other while sandwiching the board member.

A sixth aspect of the present invention is that, in any one of the first to fifth aspects, the first element and the second element are programmable logical devices, respectively.

A seventh aspect is a robot control device for controlling an operation of a robot, wherein the control circuit board according to any one of the first to sixth aspects is incorporated thereto.

Effect of the Invention

According to the present invention, a control circuit board capable of surely preventing loss of control function while suppressing enlargement of the board and increase of development/production cost, and a robot control device comprising the board can be provided.

EMBODIMENT OF THE INVENTION

Hereunder, a robot control device comprising a control circuit board according to one embodiment of the present invention will be described referring to the drawings.

Figure 1:
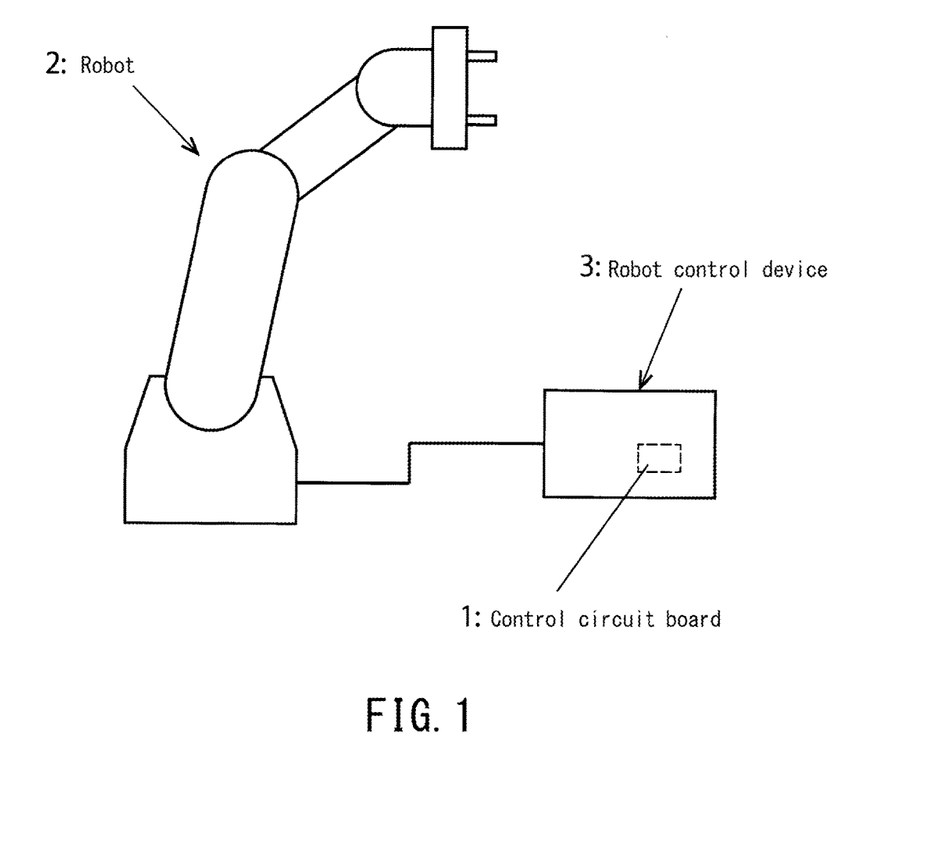
FIG. 1 is a schematic diagram illustrating a robot control device in which a control circuit board is incorporated according to one embodiment of the present invention and a robot controlled by the robot control device.

As illustrated in FIG. 1, the control circuit board 1 of this embodiment is incorporated in a robot control device 3 for controlling operations of a multi-axis robot as an industrial robot 2, and the robot control device 3 is a teaching pendant, for example. The control circuit board 1 can generate signals for emergency stop and operation permission of the robot 2, for example.

Figure 2:
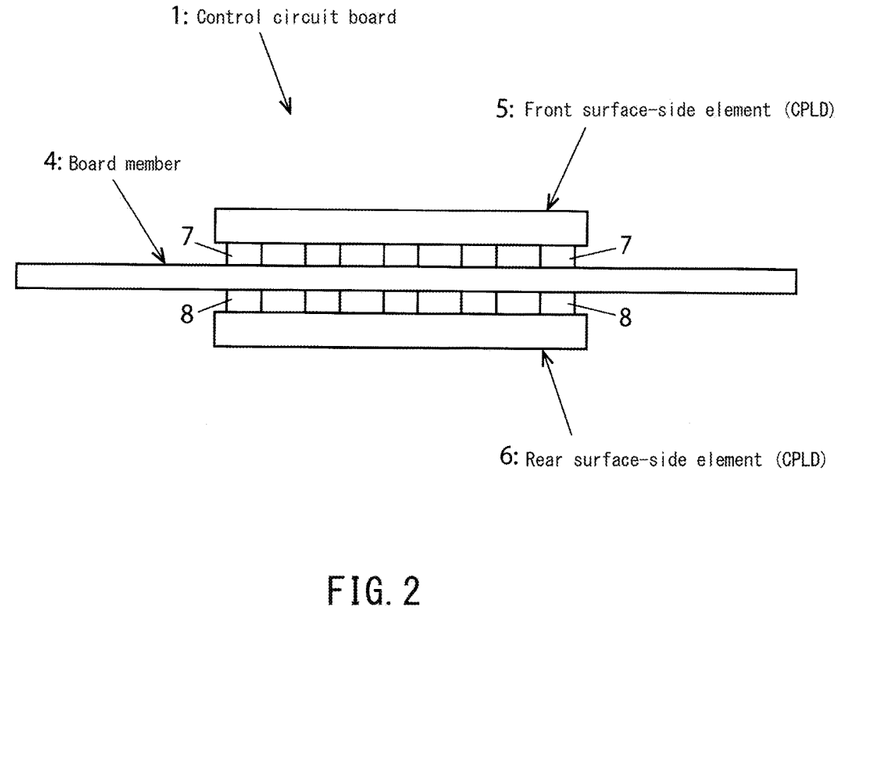
FIG. 2 is a front view illustrating a schematic configuration of a control circuit board according to one embodiment of the present invention.
Figure 3:
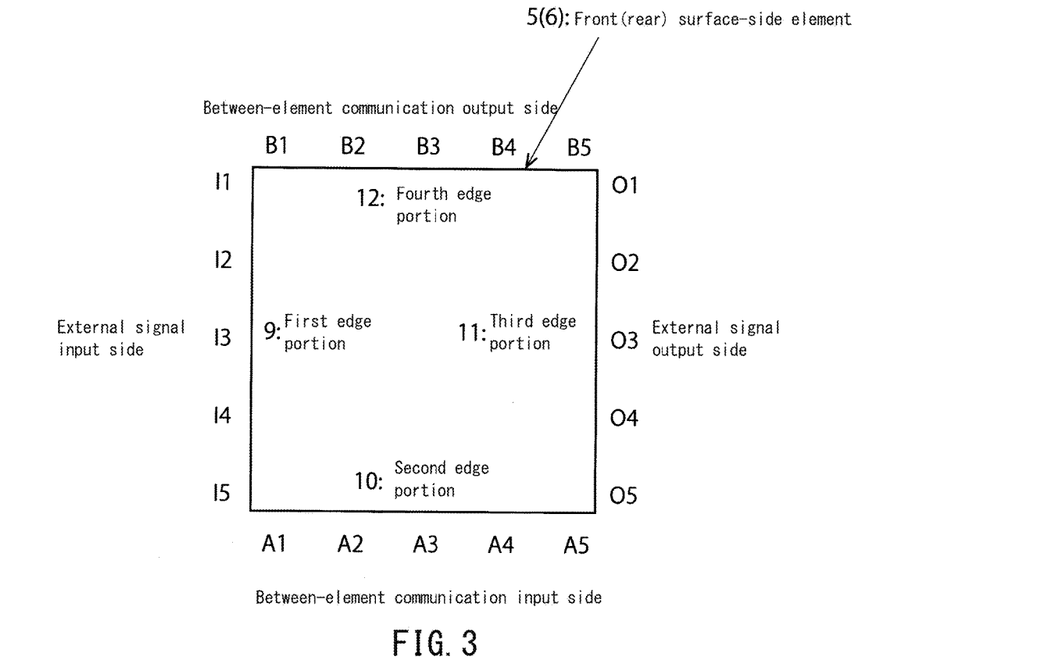
FIG. 3 is a plan view illustrating a schematic configuration of a front surface-side (rear surface-side) element in the control circuit board illustrated in FIG. 2.
Figure 4A:
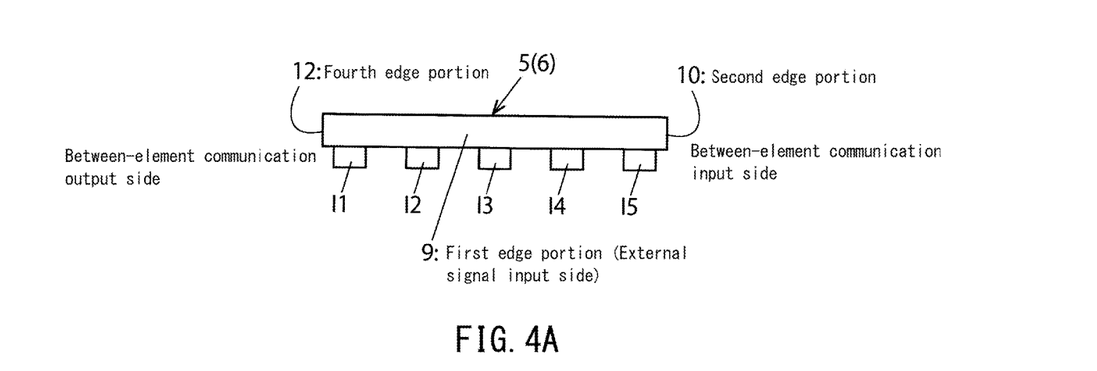
FIG. 4A is a front view illustrating a schematic configuration of the front surface-side (rear surface-side) element illustrated in FIG. 3.
Figure 4B:
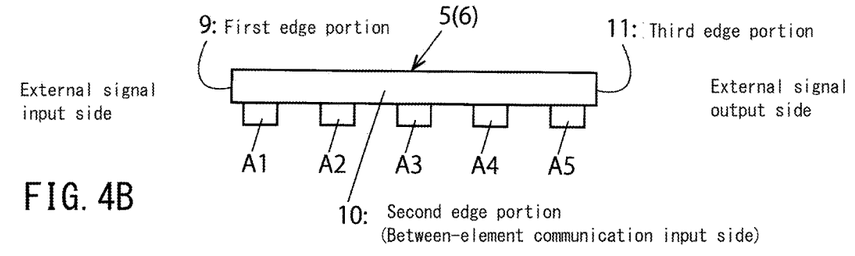
FIG. 4B is a right side view illustrating a schematic configuration of the front surface-side (rear surface-side) element illustrated in FIG. 3.
Figure 4C:
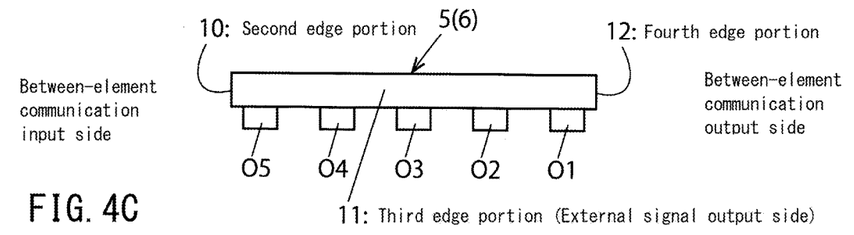
FIG. 4C is a rear view illustrating a schematic configuration of the front surface-side (rear surface-side) element illustrated in FIG. 3.
Figure 4D:
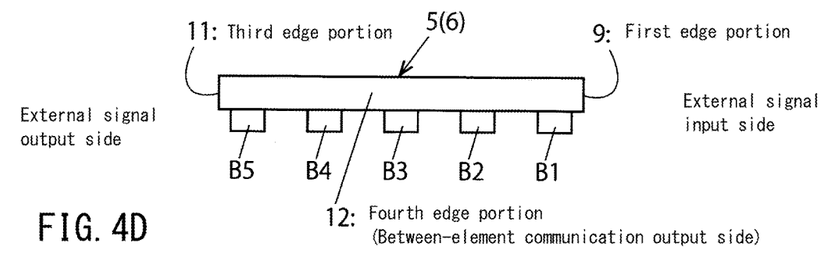
FIG. 4D is a left side view illustrating a schematic configuration of the front surface-side (rear surface-side) element illustrated in FIG. 3.

As illustrated in FIG. 2, the control circuit board 1 according to this embodiment has a board member (print board) 4, and a front surface-side element (first element) 5 and a rear surface-side element (second element) 6 which are mounted on each surface of the board member 4 respectively. The front surface-side element 5 and the rear surface-side element 6 are arranged opposite to each other while sandwiching the board member 4 therebetween.

The front surface-side element 5 and the rear surface-side element 6 are configured by a programmable logic device respectively, and preferably configured by CPLD (Complex Programmable Logic Device).

In the control circuit board 1 according to this embodiment, the front surface-side element 5 and the rear surface-side element 6 have common specifications. Thus, all arrangements regarding pin function of a plurality of pins 7, 8 arranged at respective edge portions of the elements are common between the front surface-side element 5 and the rear surface-side element 6.

As illustrated in FIG. 3, and FIGS. 4A to 4D, the front surface-side element 5 and the rear surface-side element 6 respectively have a first edge portion 9 and a third edge portion 11 which are opposite to each other, and a second edge portion 10 and a fourth edge portion 12 which are opposite to each other. A plurality of external signal input pins I1 to I5 (7, 8) are provided to the first edge portion 9 and a plurality of external signal output pins O1~O5 (7, 8) are provided to the third edge portion 11. A plurality of between-element communication input pins A1~A5 (7, 8) are provided to the second edge portion 10 and a plurality of between-element communication output pins B1 to B5 (7, 8) are provided to the fourth edge portion 12.

In the control circuit board 1 according to this embodiment, the between-element communication input pin A1 of one element 5 (6) and the between-element communication output pin B1 of the other element 6 (5) communicate with each other. Similarly, the between-element communication input pin A2 of one element 5 (6) and the between-element communication output pin B2 of the other element 6 (5) communicate with each other, the between-element communication input pin A3 of one element 5 (6) and the between-element communication output pin B3 of the other element 6 (5) communicate with each other, and the between-element communication input pin A4 of one element 5 (6) and the between-element communication output pin B4 of the other element 6 (5) communicate with each other.

Note that, although FIG. 3, and FIGS. 4A to 4D (and figures thereafter) show the configuration that five pins are provided to the respective edge portions 9 to 12, the number of pins provided to the respective edge portions is not limited to this.

Figure 5:
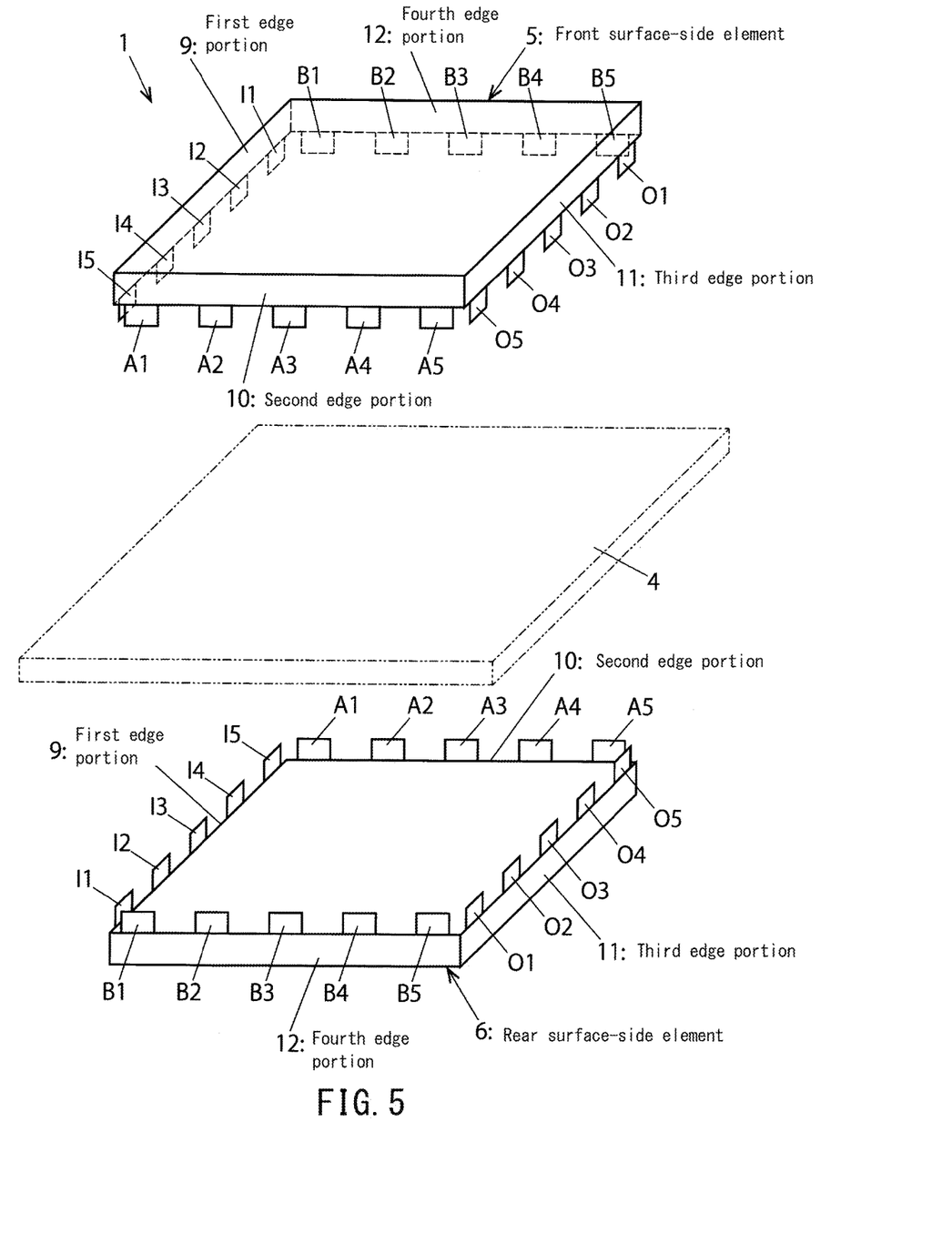
FIG. 5 is a schematic exploded perspective view illustrating an arrangement configuration of the front surface-side element and the rear surface-side element in the control circuit board illustrated in FIG. 2.

As illustrated in FIG. 5, the first edge portion 9 to the fourth edge portion 12 of the front surface-side element and the first edge portion 9 to the fourth edge portion 12 of the rear surface-side element 6 are arranged opposite to each other. Specifically, the first edge portion 9 of the front surface-side element 5 is opposite to the first edge portion 9 of the rear surface-side element 6, the second edge portion 10 of the front surface-side element 5 is opposite to the fourth edge portion 12 of the rear surface-side element 6, the third edge portion 11 of the front surface-side element 5 is opposite to the third edge portion 11 of the rear surface-side element 6, and the fourth edge portion 12 of the front surface-side element 5 is opposite to the second edge portion 10 of the rear surface-side element 6.

Note that, in this embodiment, the both elements are arranged so that the front surface-side element 5 and the rear surface-side element 6 overlap with each other completely when viewed from a direction (board perpendicular line direction) perpendicular to the front surface (rear surface) of the board member 4. Note that, however, the arrangement of the both elements 5, 6 is not limited to this, and the both elements do not necessarily need to overlap with each other completely when viewed from the board perpendicular line direction.

Figure 6A:
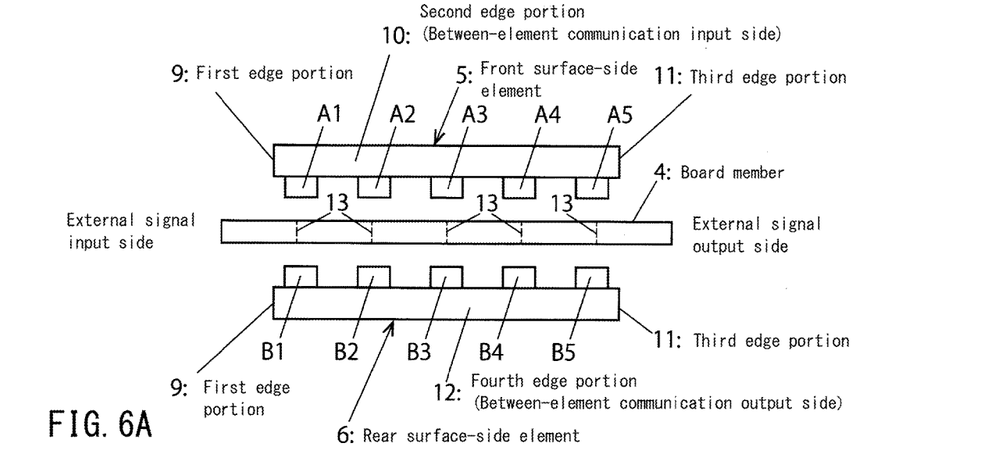
FIG. 6A is a schematic right side view illustrating an arrangement configuration of the front surface-side element, the rear surface-side element, and a board member in the control circuit board illustrated in FIG. 2.

As illustrated in FIG. 5 and FIG. 6A, the second edge portion 10 of the front surface-side element 5 and the fourth edge portion 12 of the rear surface-side element 6 are arranged opposite to each other while sandwiching the board member 4 therebetween. Thus, the between-element communication input pins A1 to A5 of the front surface-side element 5 are arranged opposite to the between-element communication output pins B1 to B5 of the rear surface-side element 6 respectively.

Figure 6B:
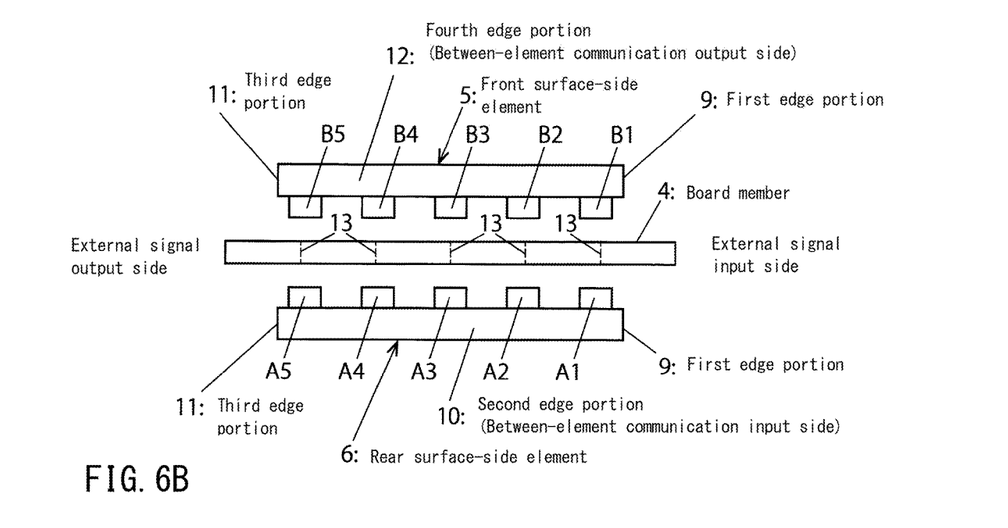
FIG. 6B is a schematic left side view illustrating an arrangement configuration of the front surface-side element, the rear surface-side element, and the board member in the control circuit board illustrated in FIG. 2.

As illustrated in FIG. 5 and FIG. 6B, the fourth edge portion 12 of the front surface-side element 5 and the second edge portion 10 of the rear surface-side element 6 are arranged opposite to each other while sandwiching the board member 4 therebetween. Thus, the between-element communication output pins B1 to B5 of the front surface-side element 5 are arranged opposite to the between-element communication input pins A1 to A5 of the rear surface-side element 6 respectively.

As illustrated in FIG. 6A and FIG. 6B, in the board member 4, a pattern (wiring) 13 is formed for electrically connecting pins between the front surface-side element 5 and the rear surface-side element 6.

Additionally, in the control circuit board 1 according to this embodiment, since pins connected by the pattern 13 are arranged opposite to each other while sandwiching the board member 4 therebetween, the length of the pattern for connecting the pins can be shortest. For example, as illustrated in FIG. 6A, the between-element communication input pin A1 of the front surface-side element 5 is arranged opposite to the between-element communication output pin B1 of the rear surface-side element 6 as a connection destination. Similarly, as illustrated in FIG. 6B, the between-element communication output pin B1 of the front surface-side element 5 is arranged opposite to the between-element communication input pin A1 of the rear surface-side element 6 as a connection destination.

Figure 7A:
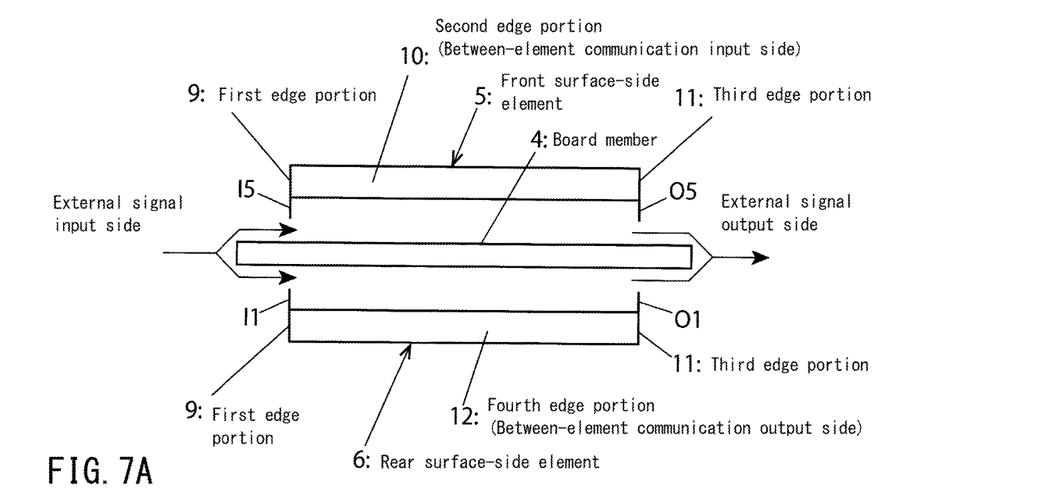
FIG. 7A is another schematic right side view illustrating an arrangement configuration of the front surface-side element, the rear surface-side element, and the board member in the control circuit board illustrated in FIG. 2.
Figure 7B:
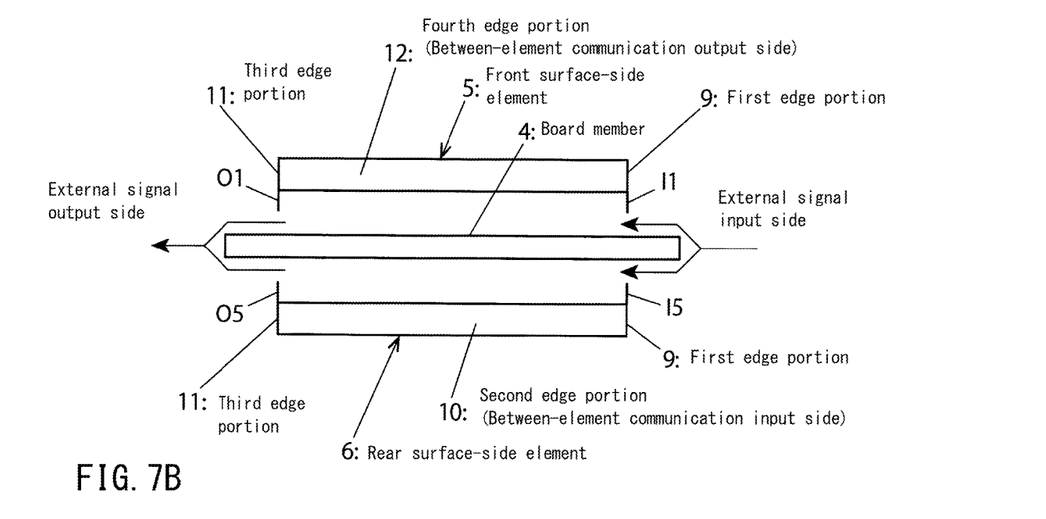
FIG. 7B is another schematic left side view illustrating an arrangement configuration of the front surface-side element, the rear surface-side element, and the board member in the control circuit board illustrated in FIG. 2.

As illustrated in FIG. 7A and FIG. 7B, in the control circuit board 1 according to this embodiment, a common external signal is input to the respective external signal input pins I1 to I5 of the front surface-side element 5 and the rear surface-side element 6. Then, normally, the common external signal is output from the respective external signal output pins O1 to O5 of the front surface-side element 5 and the rear surface-side element 6.

The signal output from the external signal output pins O1 to O5 is, for example, an input signal for generating a signal for emergency stop and operation permission of the robot 2.

In the control circuit board 1 according to this embodiment, communication is performed between the front surface-side element 5 and the rear surface-side element 6, as stated above. When abnormality occurs in one element 5 (6), the other element 6 (5) detects the abnormality, and the operation of the robot 2 is stopped while it is in operation and it cannot start operation while it is stationary. Thereby, loss of control function due to a single failure of an element configuring a control circuit can be prevented.

Additionally, in the control circuit board 1 according to this embodiment, the first edge portion 9 where the external signal input pins I1 to I5 are arranged in the front surface-side element 5 and the first edge portion 9 where the external signal input pins I1 to I5 are arranged in the rear surface-side element 6 are arranged opposite to each other, as illustrated in FIG. 7A and FIG. 7B. Similarly, the third edge portion 11 where the external signal output pins O1 to O5 are arranged in the front surface-side element 5 and the third edge portion 11 where the external signal output pins O1 to O5 are arranged in the rear surface-side element 6 are arranged opposite to each other.

Figure 8:
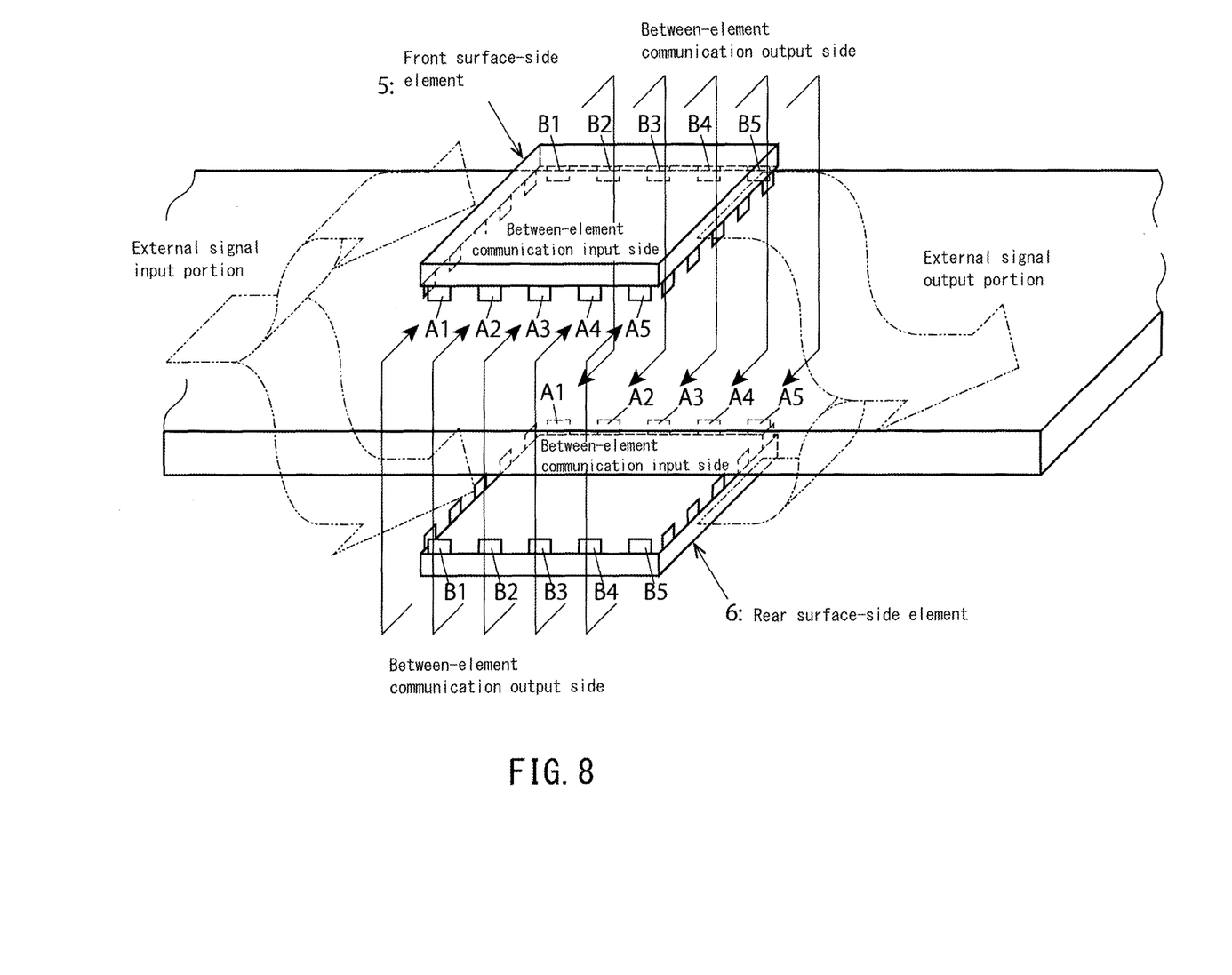
FIG. 8 is a schematic perspective view illustrating an arrangement configuration of the front surface-side element, the rear surface-side element, and the board member in the control circuit board illustrated in FIG. 2.

Thus, as illustrated in FIG. 8, the external signal input side and the external signal output side are separated and the pattern (wiring) 13 (FIG. 6A, etc.) can be simplified. Additionally, since the pattern 13 concerning between-element communication can be shortest as stated above, a pattern area in the control circuit board 1 can be reduced.

Additionally, in the control circuit board 1 according to this embodiment, since the front surface-side element 5 and the rear surface-side element 6 can use an element having a common specification, development/production cost can be reduced.

Figure 9:
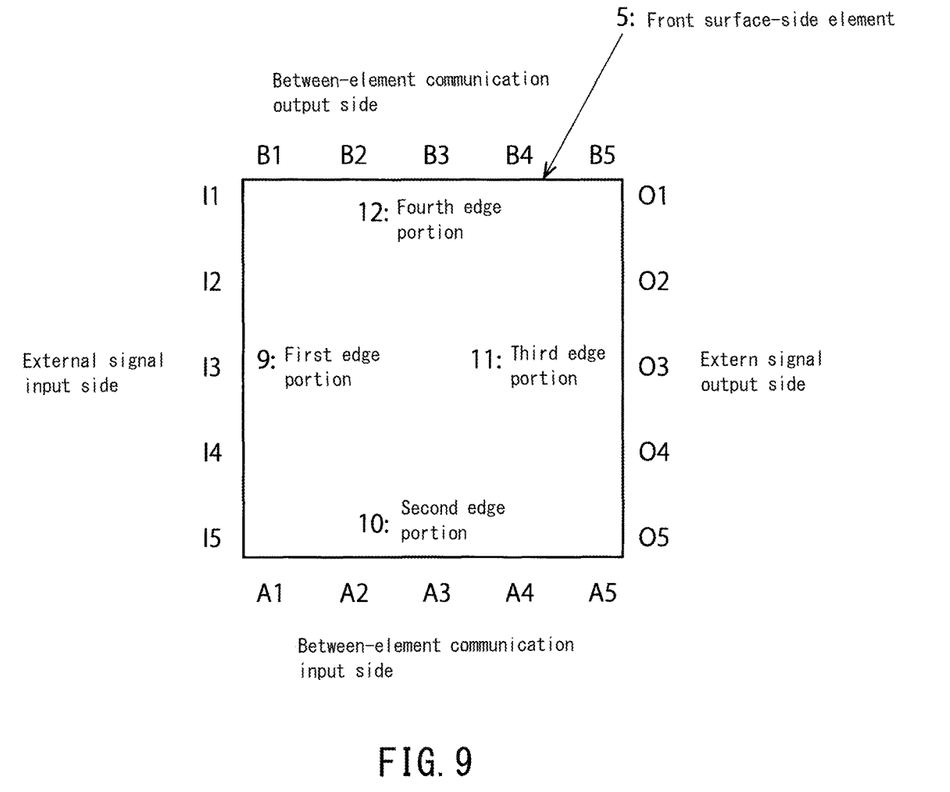
FIG. 9 is a plan view illustrating a schematic configuration of a front surface-side element in a control circuit board according to a variation of the embodiment illustrated in FIG. 2.
Figure 10:
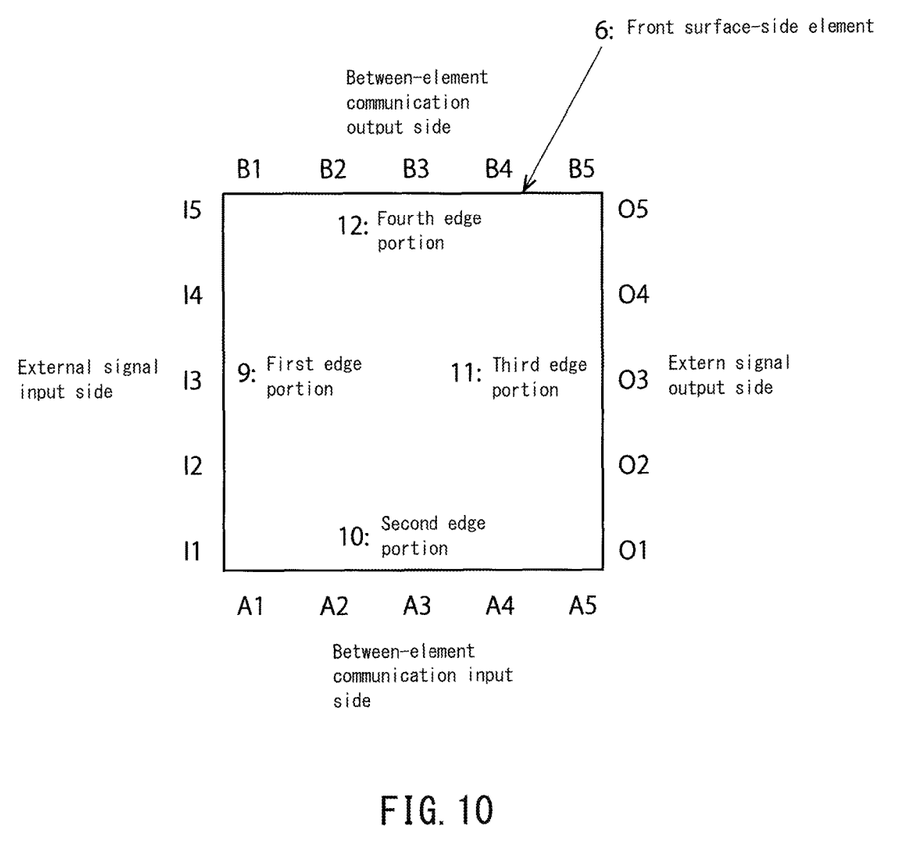
FIG. 10 is a plan view illustrating a schematic configuration of a rear surface-side element in the control circuit board according to a variation of the embodiment illustrated in FIG. 2.

As a variation of the embodiment above, as illustrated in FIG. 9 an FIG. 10, the arrangements regarding pin function of a plurality of external signal input pins I1 to I5 and a plurality of external signal output pins O1 to O5 may be inverted between the front surface-side element 5 and the rear surface-side element 6.

Figure 11:
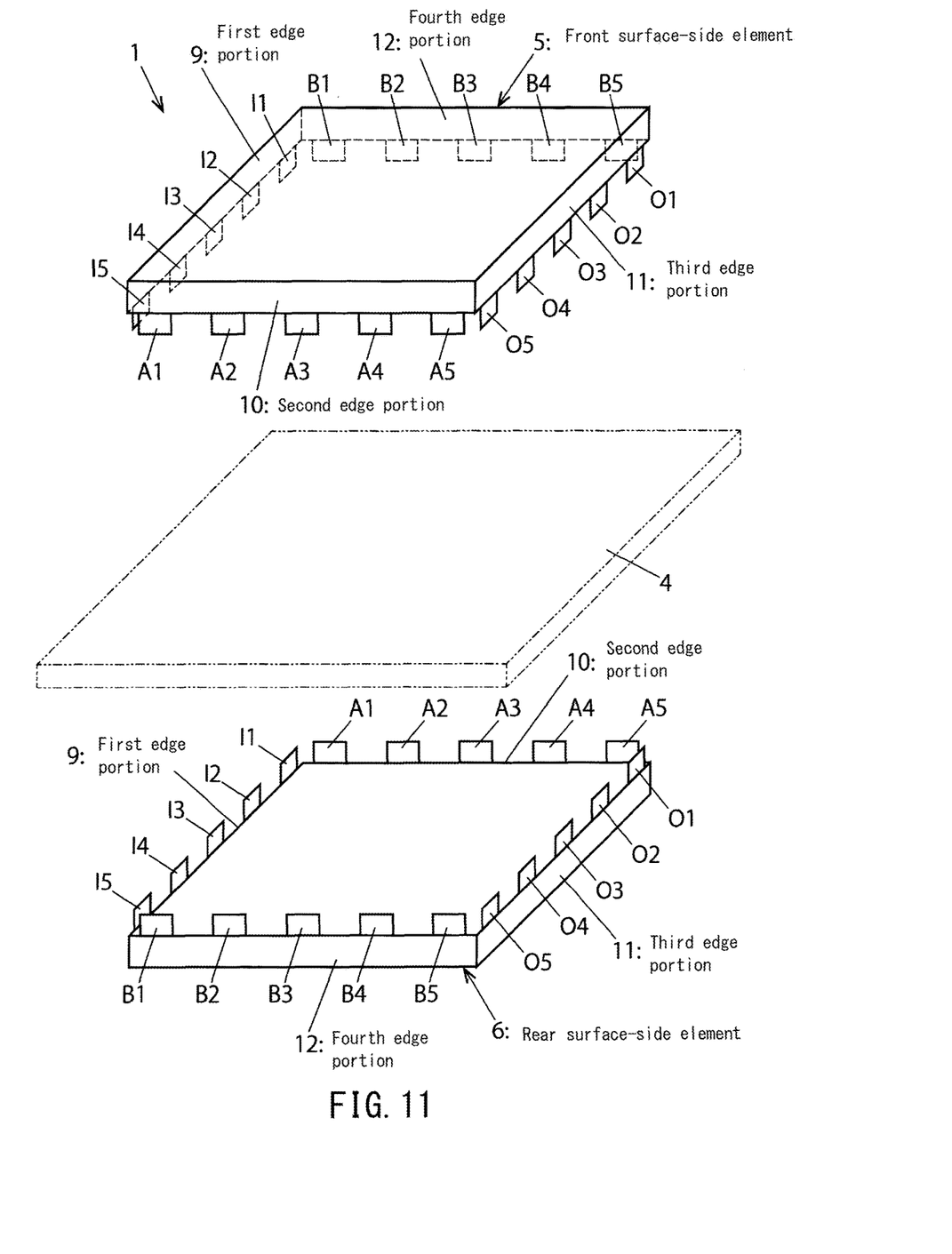
FIG. 11 is a schematic exploded perspective view illustrating an arrangement configuration of the front surface-side element and the rear surface-side element in the control circuit board according to a variation of the embodiment illustrated in FIG. 2.

In this case, as illustrated in FIG. 11, the external signal input pins I1 to I5 of the front surface-side element 5 are arranged opposite to the external signal input pins I1 to I5 of the rear surface-side element 6, respectively. Similarly, the external signal output pins O1 to O5 of the front surface-side element 5 are arranged opposite to the external signal output pins O1 to O5 of the rear surface-side element 6, respectively.

Accordingly, in this example, the pattern can be further simplified in each of the external signal input side and the external signal output side. Thereby, the pattern area in the control circuit board 1 can be further reduced.

DESCRIPTION OF REFERENCE NUMERALS

1 . . . Control circuit board
2 . . . Robot
3 . . . Robot control device
4 . . . Board member
5 . . . Front surface-side element (CPLD)
6 . . . Rear surface-side element (CPLD)
7 . . . Pin of front surface-side element
8 . . . Pin of rear surface-side element
9 . . . First edge portion
10 . . . Second edge portion
11 . . . Third edge portion
12 . . . Fourth edge portion
13 . . . Pattern
A1 to A5 . . . Between-element communication input pin
B1 to B5 . . . Between-element communication output pin
I1 to I5 . . . External signal input pin
O1 to O5 . . . External signal output pin

The invention claimed is:

1. A control circuit board which is to be incorporated in a robot control device, comprising:
   a board member; and
   a first element and a second element, the first and second elements provided on opposite surfaces of the board member to thereby sandwich the board member, wherein a pin arrangement of the first element is the same as a pin arrangement of the second element,
   wherein the first element and the second element respectively have a first edge portion and a third edge portion which are opposite to each other and a second edge portion and a fourth edge portion which are opposite to each other,
   wherein, for each of the first and second elements, a plurality of signal input pins configured to receive signals are provided to the first edge portion, a plurality of signal output pins configured to transmit signals are provided to the third edge portion, a plurality of between-element communication input pins are provided to the second edge portion, and a plurality of between-element communication output pins are provided to the fourth edge portion, such that locations of the plurality of signal input pins, signal output pins, between-element communication input pins, and between-element communication output pins on the first element are the same as locations on the second element, wherein, while the first element and second element are sandwiching the board member, the first edge portion of the first element is arranged directly opposite to the first edge portion of the second element, the third edge portion of the first element is arranged directly opposite to the third edge portion of the second element, the second edge portion of the first element is arranged directly opposite to the fourth edge portion of the second element, and the fourth edge portion of the first element is arranged directly opposite to the second edge portion of the second element, wherein a common external signal is input to the first element and the second element, respectively, via the plurality of signal input pins of the first element and the plurality of signal input pins of the second element, wherein the plurality of between-element communication input pins of one of the first element and the second element are electrically connected through the board member to the plurality of between-element communication output pins of another of the first element and the second element so that the between-element communication output pins transmit signals to the between-element communication input pins, wherein the plurality of between-element communication output pins of the one of the first element and the second element are electrically connected through the board member to the plurality of between-element communication input pins of the other of the first element and the second element, so that the between-element communication output pins transmit signals to the between-element communication input pins, and wherein the common external signal is output from the first element and the second element, respectively, via the plurality of signal output pins of the first element and the plurality of signal output pins of the second element.

2. The control circuit board according to claim 1, wherein an arrangement regarding a pin function of the plurality of between-element communication input pins and the plurality of between-element communication output pins is common between the first element and the second element.

3. The control circuit board according to claim 1, wherein an arrangement regarding a pin function of the plurality of signal input pins and the plurality of signal output pins is common between the first element and the second element.

4. The control circuit board according to claim 1, wherein an arrangement regarding a pin function of the plurality of signal input pins and the plurality of signal output pins is inverted between the first element and the second element.

5. The control circuit board according to claim 1, wherein the first element and the second element are programmable logical devices, respectively.

6. A robot control device for controlling an operation of a robot, wherein the control circuit board according to claim 1 is incorporated therein.

* * * * *